(12) United States Patent
Nishikawa et al.

(10) Patent No.: US 11,189,335 B2
(45) Date of Patent: Nov. 30, 2021

(54) DOUBLE WRITE/READ THROUGHPUT BY CMOS ADJACENT ARRAY (CAA) NAND MEMORY

(71) Applicant: SanDisk Technologies LLC, Addison, TX (US)

(72) Inventors: Masatoshi Nishikawa, Nagoya (JP); Hardwell Chibvongodze, Hiratsuka (JP); Ken Oowada, Fujisawa (JP)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/683,209

(22) Filed: Nov. 13, 2019

(65) Prior Publication Data

US 2021/0142841 A1   May 13, 2021

(51) Int. Cl.
*G11C 11/408* (2006.01)
*G11C 7/14* (2006.01)
*G11C 11/4094* (2006.01)
*H01L 27/06* (2006.01)
*G11C 11/4074* (2006.01)
*G11C 11/56* (2006.01)
*G11C 11/4091* (2006.01)

(52) U.S. Cl.
CPC ............ *G11C 11/4085* (2013.01); *G11C 7/14* (2013.01); *G11C 11/4074* (2013.01); *G11C 11/4091* (2013.01); *G11C 11/4094* (2013.01); *G11C 11/5635* (2013.01); *H01L 27/0688* (2013.01)

(58) Field of Classification Search
CPC ............ G11C 11/4085; G11C 11/4074; G11C 11/5635; G11C 11/4091; G11C 11/4094; G11C 7/14; H01L 27/0688
See application file for complete search history.

(56) References Cited

U.S. PATENT DOCUMENTS

| 10,283,493 | B1 | 5/2019 | Nishida |
| 2007/0070699 | A1* | 3/2007 | Lee ............ G11C 7/14 365/185.17 |
| 2007/0183203 | A1 | 8/2007 | Park et al. |
| 2013/0314992 | A1* | 11/2013 | Takagiwa ......... G11C 29/04 365/185.09 |
| 2014/0056072 | A1 | 2/2014 | Hung |
| 2014/0219025 | A1 | 8/2014 | Kang |
| 2016/0181198 | A1* | 6/2016 | Kim ............ H01L 27/10814 257/532 |
| 2019/0043836 | A1 | 2/2019 | Fastow et al. |

OTHER PUBLICATIONS

International Search Report and Written Opinion, PCT/US2020/024410, dated Aug. 3, 2020.

* cited by examiner

*Primary Examiner* — Sultana Begum
(74) *Attorney, Agent, or Firm* — Dickinson Wright PLLC; Steven Hurles

(57) ABSTRACT

A three-dimensional (3D) memory is provided, including a memory array chip and a complementary metal-oxide semiconductor (CMOS) chip disposed on the memory array chip. The memory chip provides double write/read throughput and includes a lower region with a lower array of memory cells, lower word lines, and a lower bit line, while an upper region includes an upper array of memory cells, upper word lines, and an upper bit line. A source line is disposed between the lower and upper regions and is connected to both the lower array of memory cells and the upper array of memory cells.

20 Claims, 17 Drawing Sheets

DOUBLE WRITE/READ THROUGHPUT BY CMOS ADJACENT ARRAY (CAA) NAND MEMORY

BACKGROUND

1. Field

Apparatuses and methods consistent with example embodiments relate to a three-dimensional (3D) memory cell Complementary metal-oxide-semiconductor (CMOS) adjacent to Array (CaA) NOT-AND (NAND) architecture, and more specifically, to a 3D CaA NAND architecture providing double write and read throughput.

2. Description of the Related Art

3D NAND flash memory is a type of non-volatile flash memory in which memory cells are stacked vertically in multiple layers. 3D NAND was developed to address challenges encountered in scaling two dimensional (2D) NAND technology to achieve higher densities at a lower cost per bit.

A memory cell is an electronic device or component capable of storing electronic information. Non-volatile memory may utilize floating-gate transistors, charge trap transistors, or other transistors as memory cells. The ability to adjust the threshold voltage of a floating-gate transistor or charge trap transistor allows the transistor to act as a non-volatile storage element (i.e. a memory cell), such as a single-level cell (SLC) which stores a single bit of data. In some cases more than one data bit per memory cell can be provided (e.g., in a multi-level cell) by programming and reading multiple threshold voltages or threshold voltage ranges. Such cells include, but are not limited to a multi-level cell (MLC), storing two bits per cell; a triple-level cell (TLC), storing three bits per cell; and a quad-level cell (QLC), storing four bits per cell.

FIG. 1 illustrates a diagram of an example 3D NAND memory array 100. In this example, the memory array 100 is a 3D NAND memory array. However, this is just one example of a memory array. The memory array 100 includes multiple physical layers that are monolithically formed above a substrate 34, such as a silicon substrate.

Storage elements, for example memory cells 101, are arranged in arrays in the physical layers. A memory cell 101 includes a charge trap structure 44 between a word line 150 and a conductive channel 42. Charge can be injected into or drained from the charge trap structure 44 via biasing of the conductive channel 42 relative to the word line 150. For example, the charge trap structure 44 can include silicon nitride and can be separated from the word line 150 and the conductive channel 42 by a gate dielectric, such as a silicon oxide. An amount of charge in the charge trap structure 44 affects an amount of current through the conductive channel 42 during a read operation of the memory cell 101 and indicates one or more bit values that are stored in the memory cell 101.

The 3D memory array 100 includes multiple blocks 80. Each block 80 includes a "vertical slice" of the physical layers that includes a stack of word lines 150. Multiple conductive channels 42 (having a substantially vertical orientation, as shown in FIG. 1) extend through the stack of word lines 150. Each conductive channel 42 is coupled to a storage element in each word line 150, forming a NAND string of storage elements, extending along the conductive channel 42. FIG. 1 illustrates three blocks 80, five word lines 150 in each block 80, and three conductive channels 42 in each block 80 for clarity of illustration. However, the 3D memory array 100 can have more than three blocks, more than five word lines per block, and more than three conductive channels per block.

Physical block circuitry is coupled to the conductive channels 42 via multiple conductive lines: bit lines, illustrated as a first bit line BL0, a second bit line BL1, and a third bit line BL2 at a first end of the conductive channels (e.g., an end most remote from the substrate 34) and source lines, illustrated as a first source line SL0, a second source line SL1, and a third source line SL2, at a second end of the conductive channels (e.g., an end nearer to or within the substrate 234). The physical block circuitry 252 is illustrated as coupled to the bit lines BL0-BL2 via "P" control lines, coupled to the source lines SL0-SL2 via "M" control lines, and coupled to the word lines 150 via "N" control lines. Each of P, M, and N can have a positive integer value based on the specific configuration of the 3D memory array 100.

Each of the conductive channels 42 is coupled, at a first end to a bit line BL, and at a second end to a source line SL. Accordingly, a group of conductive channels 42 can be coupled in series to a particular bit line BL and to different source lines SL.

It is noted that although each conductive channel 42 is illustrated as a single conductive channel, each of the conductive channels 42 can include multiple conductive channels that are in a stack configuration. The multiple conductive channels in a stacked configuration can be coupled by one or more connectors. Furthermore, additional layers and/or transistors (not illustrated) may be included as would be understood by one of skill in the art.

Among other things, the physical block circuitry 170 facilitates and/or effectuates read and write operations performed on the 3D memory array 100. For example, data can be stored to storage elements coupled to a word line 150 and the circuitry 170 can read bit values from the memory cells 101.

There are three different types of 3D cell architecture structures: CMOS next-to Array (CnA), CMOS under Array (CuA), and CMOS adjacent to Array (CaA). Regardless of the cell architecture, there is a continuing need for increased memory density for future generations of memory devices.

However, while memory density is continually improving, improved read and program throughput will also be required to go hand-in-hand with larger memory densities. Memory may be increased, by increasing page size and increasing the number of bit lines. However, with this increase in bit lines, there may be a undesirable slower ramp-up of the word lines. Another approach to increasing memory is simply increasing the number of memory blocks. However, this also has a negative impact on performance due to an increased loading on the bit lines. An increase in the number of blocks may increase memory density, but it does not improve the read and program throughput.

One approach to improving read and program throughput is to include more planes per chip, thus enabling the programming of more planes at the same time. However, this approach necessarily has an undesirable impact on the chip size. Program throughput may be increased by increasing programming parallelism (i.e. inputting data to one page of a memory chip while programming the previous page) without incurring additional data transfer latency (i.e. cache operations); however this method alone, is insufficient to satisfy the need for improved read and program throughput to address ever-increasing memory densities.

SUMMARY

Example embodiments may address at least the above problems and/or disadvantages and other disadvantages not described above. Also, example embodiments are not required to overcome the disadvantages described above, and may not overcome any of the problems described above.

According to an aspect of an example embodiment, a memory array chip comprises a lower region comprising an array of lower memory cells, a plurality of lower word lines, and a lower bit line disposed below the plurality of lower word lines; a source line disposed above the lower region; an upper region comprising an array of upper memory cells, a plurality of upper word lines, and an upper bit line disposed above the plurality of upper word lines; wherein the source line is connected to the array of lower memory cells and to the array of upper memory cells.

The upper bit line may comprise copper and the lower bit line may comprises tungsten.

The lower region may further comprise a lower drain side select gate disposed above the lower word lines and adjacent to the source line, and a lower source side select gate disposed below the lower word lines and adjacent to the lower bit line. The upper region may further comprise an upper drain side select gate disposed below the upper word lines and adjacent to the source line, and an upper source side select gate disposed above the upper word lines and adjacent to the upper bit line.

According to an aspect of an example embodiment, a three-dimensional (3D) memory comprises a memory array chip comprising a lower array comprising a plurality of lower memory cells, a plurality of lower word lines, and a lower bit line disposed below the plurality of lower word lines; a source line disposed above the lower array; an upper array comprising a plurality of upper memory cells, a plurality of upper word lines, and an upper bit line disposed above the plurality of upper word lines; wherein the source line is connected to the plurality of lower memory cells and to the plurality of upper memory cells; and a complementary metal-oxide semiconductor (CMOS) chip disposed above the memory array chip and bonded to the memory array chip.

The upper bit line may comprise copper and the lower bit line may comprise tungsten.

The CMOS chip comprises a first plurality of data latches connected to the upper bit line and a second plurality of data latches connected to the lower bit line.

The lower region of the memory cell chip may further comprise a lower drain side select gate disposed above the lower word lines and adjacent to the source line, and a lower source side select gate disposed below the lower word lines and adjacent to the lower bit line; and the upper region of the memory cell chip further comprises an upper drain side select gate disposed below the upper word lines and adjacent to the source line, and an upper source side select gate disposed above the upper word lines and adjacent to the upper bit line.

According to an aspect of an example embodiment, a method of operating a memory chip comprising a lower region comprising a lower memory cell array, an upper region comprising an upper memory cell array, and a source line connected to the lower memory cell array and to the upper memory cell array, the method comprising at a same time: applying a voltage to memory cells of the upper memory cell array and to memory cells of the lower memory cell array via the source line; applying a voltage to at least one memory cell of the upper memory cell array via an upper bit line; and applying a voltage to at least one memory cell of the lower memory cell array via a lower bit line.

The method may be an erase method and the applying the voltage via the source line may comprise applying an erase voltage to the source line, the applying a voltage via the upper bit line may comprise applying an erase voltage to the at least one memory cell of the upper memory cell array via the upper bit line; and the method may further comprise, at the same time: applying an isolation voltage to a plurality of upper word lines connected to the upper memory cell array; and floating a plurality of lower word lines connected to the lower memory cell array.

The applying the erase voltage to the upper bit line may comprise applying the erase voltage via a complementary metal-oxide semiconductor (CMOS) chip bonded to the memory chip.

The method may be a read method further comprising, at the same time: applying a voltage to a selected word line connected to the upper memory cell array and applying a voltage to a selected word line connected to the lower memory cell array, thereby simultaneously reading a memory cell of the upper memory cell array and a memory cell of the lower memory cell array.

The method may be a program method further comprising, at the same time: applying a program voltage to a selected word line connected to the upper memory cell array and applying the program voltage to a selected word line connected to the lower memory cell array, thereby simultaneously programming a memory cell of the upper memory cell array and a memory cell of the lower memory cell array.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
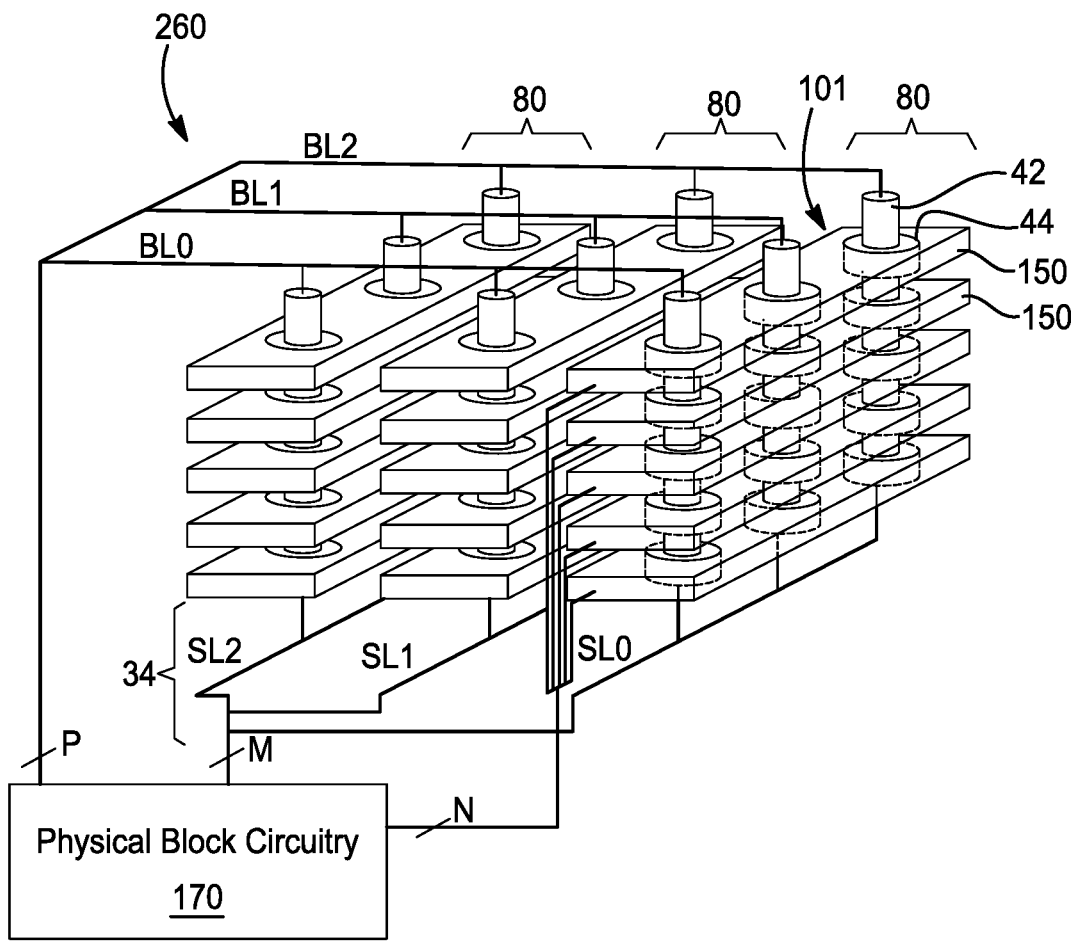
FIG. 1 illustrates a diagram of an example 3D NAND memory array, according to an example embodiment.

Reference will now be made in detail to example embodiments which are illustrated in the accompanying drawings, wherein like reference numerals refer to like elements throughout. In this regard, the example embodiments may have different forms and may not be construed as being limited to the descriptions set forth herein.

It will be understood that the terms "include," "including", "comprise, and/or "comprising," when used in this specification, specify the presence of stated features, integers, steps, operations, elements, and/or components, but do not preclude the presence or addition of one or more other features, integers, steps, operations, elements, components, and/or groups thereof.

It will be further understood that, although the terms "first," "second," "third," etc., may be used herein to describe various elements, components, regions, layers and/or sections, these elements, components, regions, layers and/or sections may not be limited by these terms. These terms are only used to distinguish one element, component, region, layer or section from another element, component, region, layer or section.

As used herein, the term "and/or" includes any and all combinations of one or more of the associated listed items. Expressions such as "at least one of," when preceding a list of elements, modify the entire list of elements and do not modify the individual elements of the list. In addition, the terms such as "unit," "-er (-or)," and "module" described in the specification refer to an element for performing at least one function or operation, and may be implemented in hardware, software, or the combination of hardware and software.

Various terms are used to refer to particular system components. Different companies may refer to a component by different names—this document does not intend to distinguish between components that differ in name but not function.

Matters of these example embodiments that are obvious to those of ordinary skill in the technical field to which these example embodiments pertain may not be described here in detail.

There are three different types of 3D cell architecture structures: Complementary metal-oxide-semiconductor (CMOS) next-to Array (CnA), CMOS under Array (CuA), and CMOS adjacent to Array (CaA). With respect to each of these cell architectures, there is a continuing need for increased memory density for future generations of memory devices.

However, while memory density is continually improving, improved read and program throughput is also be required to go hand-in-hand with larger memory densities.

Memory may be increased, by increasing page size and increasing a number of bit lines. However, with this increase in bit lines, there may be an undesirably slower ramp-up of the word lines. Another approach to increasing memory is simply increasing the number of memory blocks. However, this also has a negative impact on performance due to an increased loading on the bit lines. An increase in the number of blocks may increase memory density, but it does not improve the read and program throughput.

One approach to improving read and program throughput is to include more planes per chip, thus enabling the programming of more planes at the same time. However, this approach necessarily has an undesirable impact on the chip size. Program throughput may be increased by increasing programming parallelism (i.e. inputting data to one page of a memory chip while programming the previous page) without incurring additional data transfer latency (i.e. cache operations).

One or more example embodiments described herein are directed to increasing the read and program throughput as memory density is improved.

As discussed above, a block of memory includes memory holes with a source line at the bottom of the array, as shown with respect to FIG. 1, with all the word lines disposed above the source line.

Figure 2:
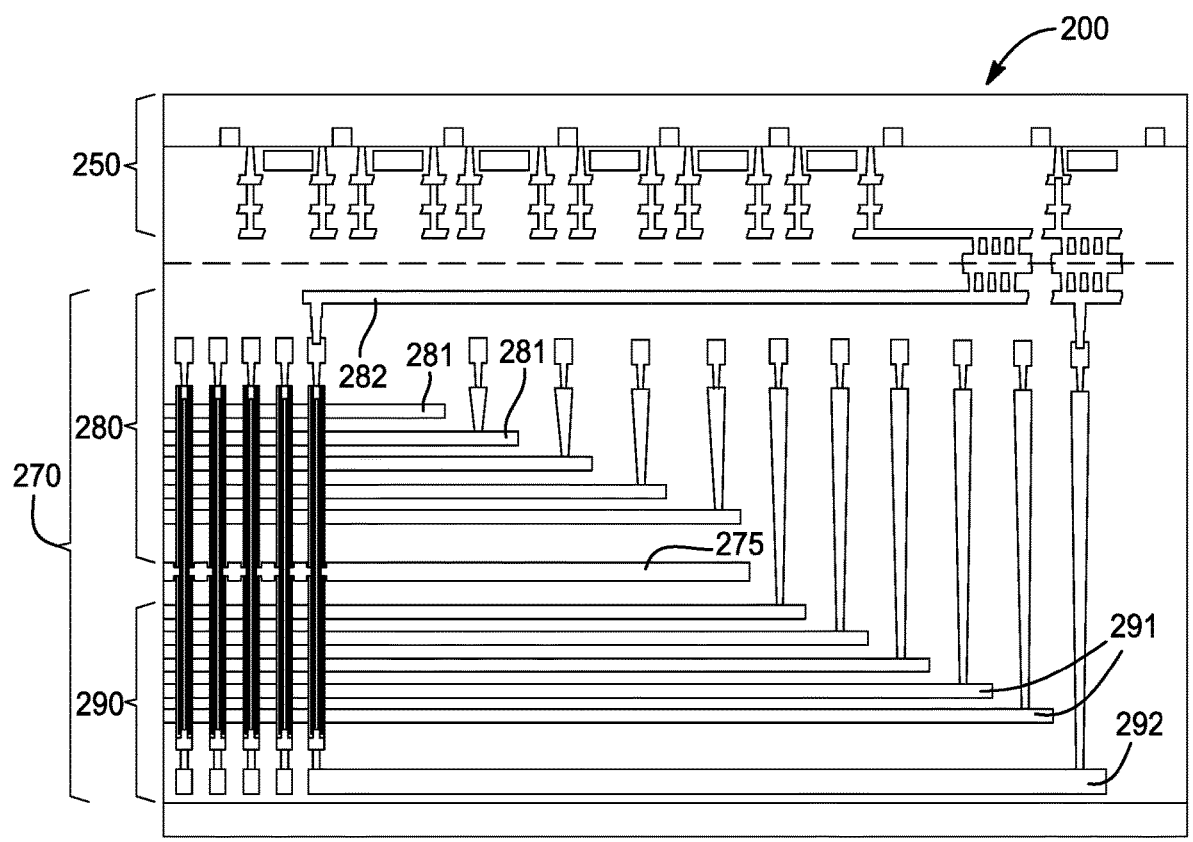
FIG. 2 is a schematic cross-section of a CaA memory architecture 200, according to an example embodiment.

FIG. 2 is a schematic cross-section of a CaA memory architecture 200 according to an example embodiment. As shown, the CaA architecture of this embodiment includes a CMOS wafer (chip) 250 and a cell wafer (chip) 270, bonded together. In the cell chip 270, a source line 275 is disposed between an upper region 280 including upper word lines 281 and a lower region 290 including lower word lines 291. The upper word lines 281 are connected to a bit line 282 disposed above the upper word lines 281. The lower word lines 291 are connected to a bit line 292 disposed below the lower word lines 291. Only a single bit line is illustrated in the upper region and only a single bit line is illustrated in the lower region. However, as would be understood by one of skill in the art, each of the upper and lower regions include a plurality of bit lines connected to the plurality of channels therein.

This duplication of bit lines requires more space than a single bit line. For example, each bit line is connected to a sense amplifier (SA) and to a set of data latches. Thus, the number of SA and data latches are also doubled within the CMOS, and a double-sized YLOG is also used. Nonetheless, the overall size of the memory architecture 200 is not increased, due to the use of the separate CMOS chip 250. In other words, as the sense amplifiers (not illustrated), data latches, and YLOG are all located in the CMOS chip which is adjacent to the cell wafer, the overall size is not inconveniently increased.

In a memory array, such as illustrated in FIG. 2, the selection of the column (in a y-direction) is controlled by the YLOG.

YLOG is the combination of data latches and a group of control circuit blocks that control data shift (the input and output of data) between the data latches and the user. The circuit blocks also control the setting and resetting of the data latches as well as the transfer of data from one data latch to another. The YLOG controls one page of data at a time.

According to this example embodiment, the memory architecture includes the upper and lower regions 280 and 290 and corresponding upper and lower bit lines 282 and 292, and therefore, the YLOG circuitry is doubled, as compared to a related art architecture. However, as with the additional bit lines, the overall size is not increased. There is no chip size increase because two wafers are used—the cell chip and the CMOS chip—and the YLOG area is included in the CMOS wafer.

As noted above, an upper bit line 282 is disposed in the upper region 280, and a lower bit line 292 is disposed in the lower region 290. With two bit lines, the resistance of the upper bit line 282 and the resistance of the lower bit line 292 should be comparable.

It has been determined that a tungsten bit line can be employed with a resistivity comparable to that of a copper bit line with respect to a bit line width of less than 15 nm. Accordingly, in this example embodiment, the upper bit line 282 may be made from copper, and the lower bit line 292 may be tungsten. Tungsten also provides good thermal stability.

Figure 3:
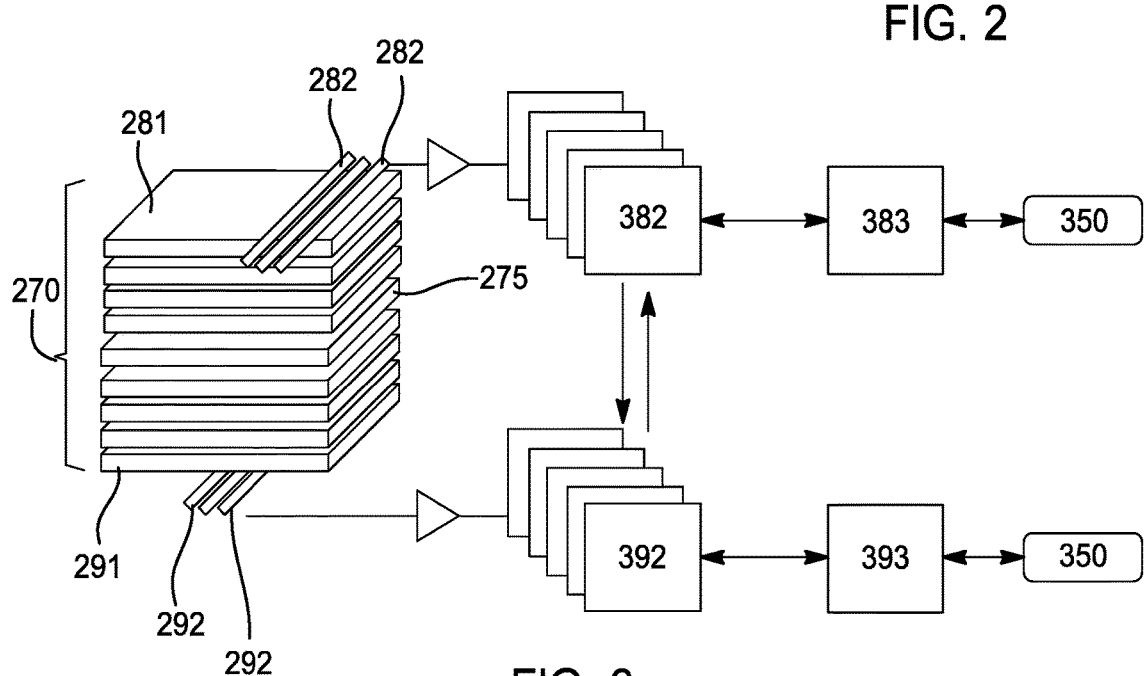
FIG. 3 is a schematic view of connections of a cell chip to data latches, according to an example embodiment.

FIG. 3 is a schematic view of connections of the cell chip 270 to a user 350 through upper data latches 382 and 383 and lower data latches 392 and 393, according to an example embodiment.

As previously described, the source line 275 is disposed in the middle of the cell chip 270, separating upper pages of the upper region 280 from lower pages of the lower region 290. Accordingly, with a set of upper bit lines 282 for the upper pages and a set of lower bit lines 292 for the lower pages, two pages, one upper and one lower, can be accessed at the same time. Data latches 382 are connected to the upper bit lines 282, and data latches 392 are connected to the lower bit lines 292. The data latches connect the memory card to the user 350.

According to this example embodiment, there is also an option to connect together the upper and lower data latches to realize more robust calculations.

Figure 4:
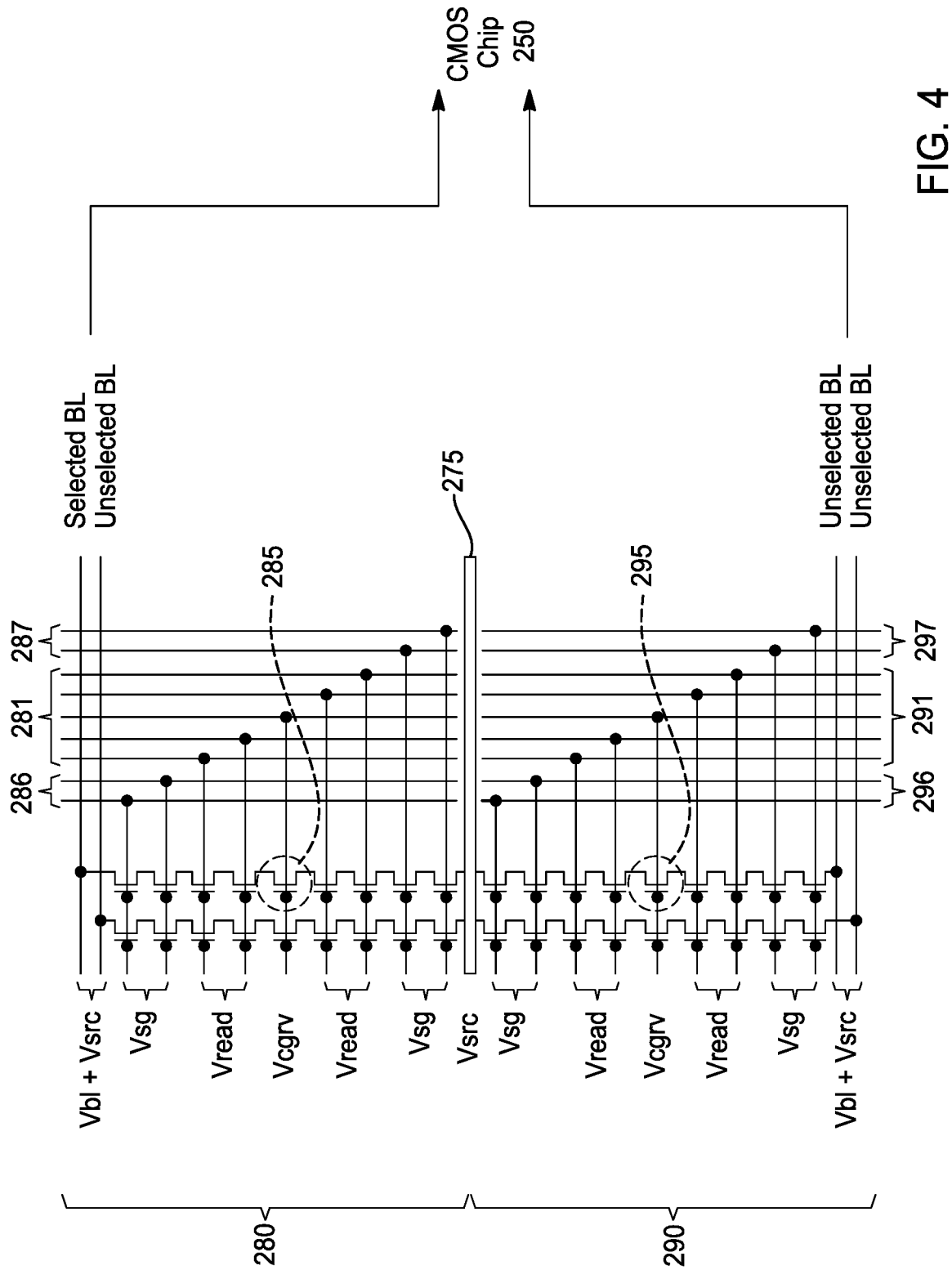
FIG. 4 illustrates voltages applied to lines of a memory cell chip during a read operation, according to an example embodiment.

FIG. 4 schematically illustrates read and program verify operations of a cell chip 270 according to an example embodiment. In addition to the source line 275, and the upper and lower word lines 281 and 291, the upper drain side select gate 286 and upper source side select gate 287, as well as the lower drain side select gate 296 and lower source side select gate 297 are illustrated.

FIG. 4 illustrates the voltages applied to the various lines during a read, when one upper page and one lower page are accessed, and read data is transmitted to the user via the CMOS chip. The voltages—the bit line voltage (Vbl), the source line voltage (Vsrc), the select gate voltage (Vsg), and the read voltage (Vread) are applied to the bit lines, word lines, and source line, as shown in FIG. 4, when a cell 285 is selected in the upper region 280, and a cell 295 is selected in the lower region 290. A control gate verify and read voltage (Vcgrv) is applied to the selected upper and lower word lines 285 and 295; a select gate voltage (Vsg) is applied to the source side and drain side select gates in the upper and lower regions; a read voltage (Vread) is applied to the unselected upper and lower word lines; and a voltage Vbl+Vsrc is applied to the upper and lower bit lines.

Figure 5:
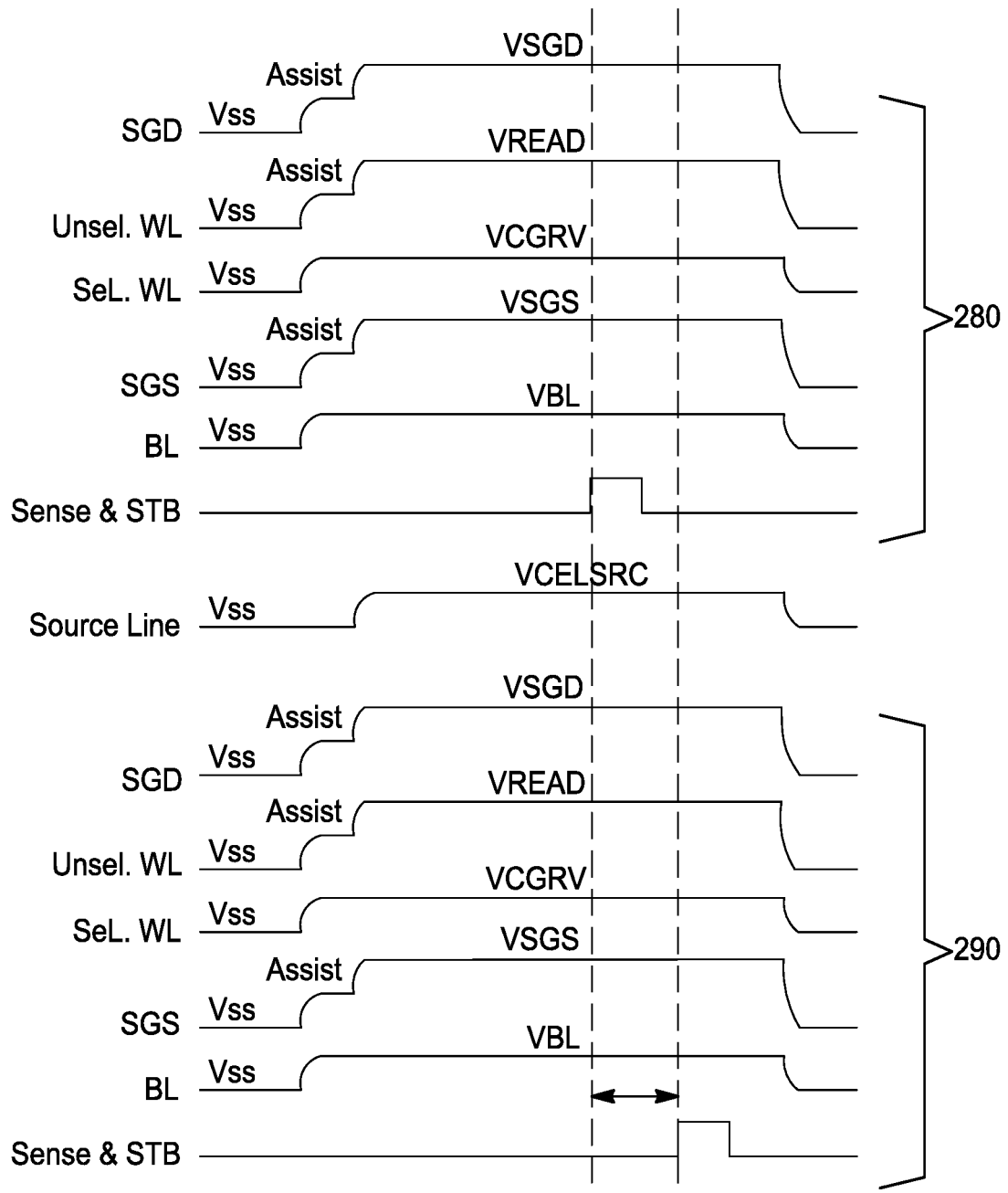
FIG. 5 illustrates example waveforms of voltages applied during the read operation of FIG. 4.

FIG. 5 illustrates example waveforms of the voltages applied to the various lines during a read operation. As shown by the arrow in FIG. 5, the sense pulses for the upper and lower word lines are shifted to avoid source line noise, and the strobe pulses are shifted to avoid source bias (VSS) noise during an analog-to-digital conversion of the sensed data.

Figure 6:
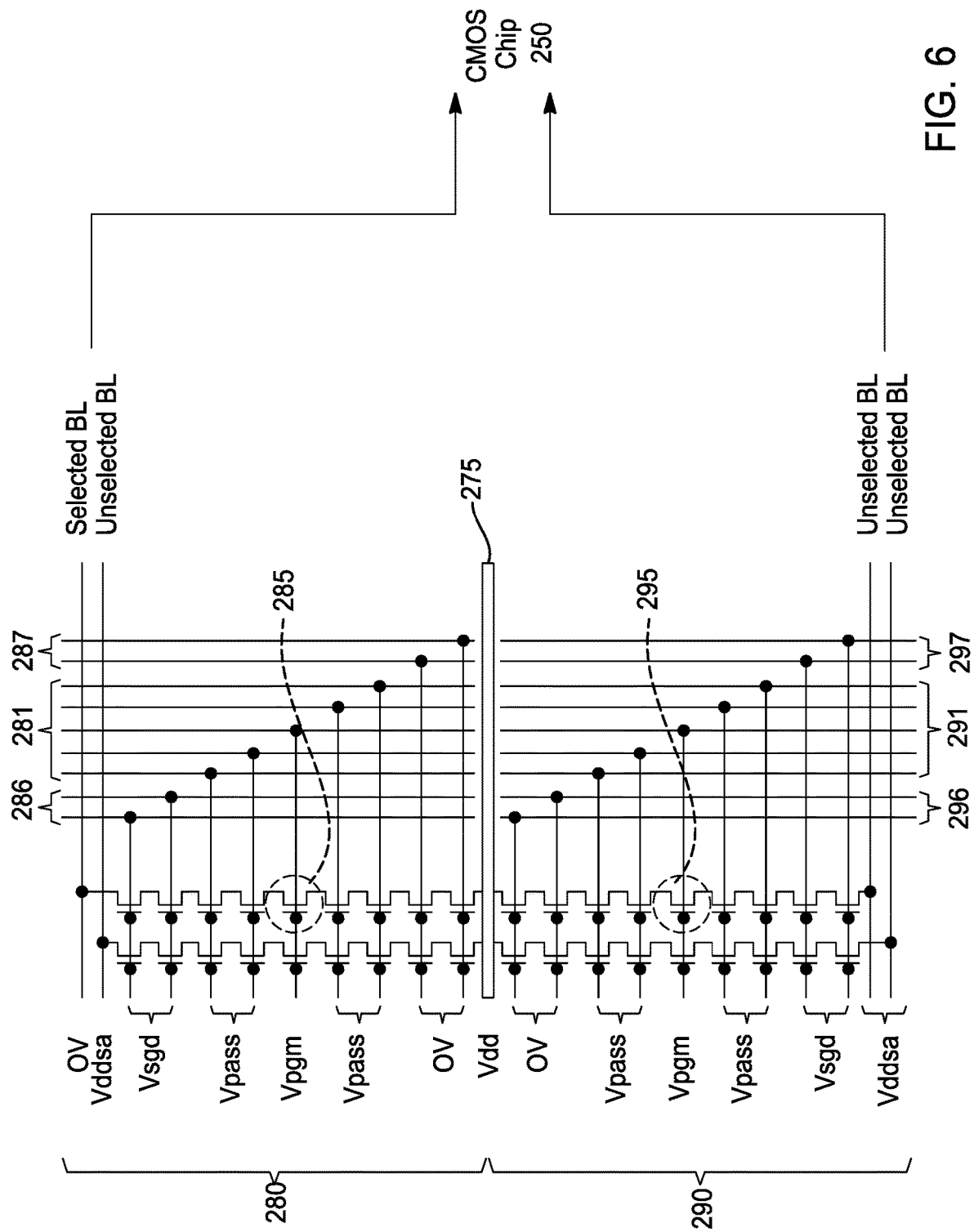
FIG. 6 illustrates voltages applied to lines of a memory cell chip during a program operation, according to an example embodiment.

FIG. 6 illustrates the voltages applied to the various word lines during a program operation according to an example embodiment. As would be understood by one of skill in the art, a high voltage program voltage (Vpgm) is applied to the selected word line, and a low voltage pass voltage (Vpass) is applied to the unselected word lines. Vsgd is the voltage applied to the drain side select gate. On the source side, 0 V is applied to the source side select gates, which, in the lower region 290, are disposed above the word lines, adjacent to the source line 275. As can be seen, the voltages applied to the lower region 290 are mirrored by the voltages applied to the upper region 280, and vice-versa.

Figure 7:
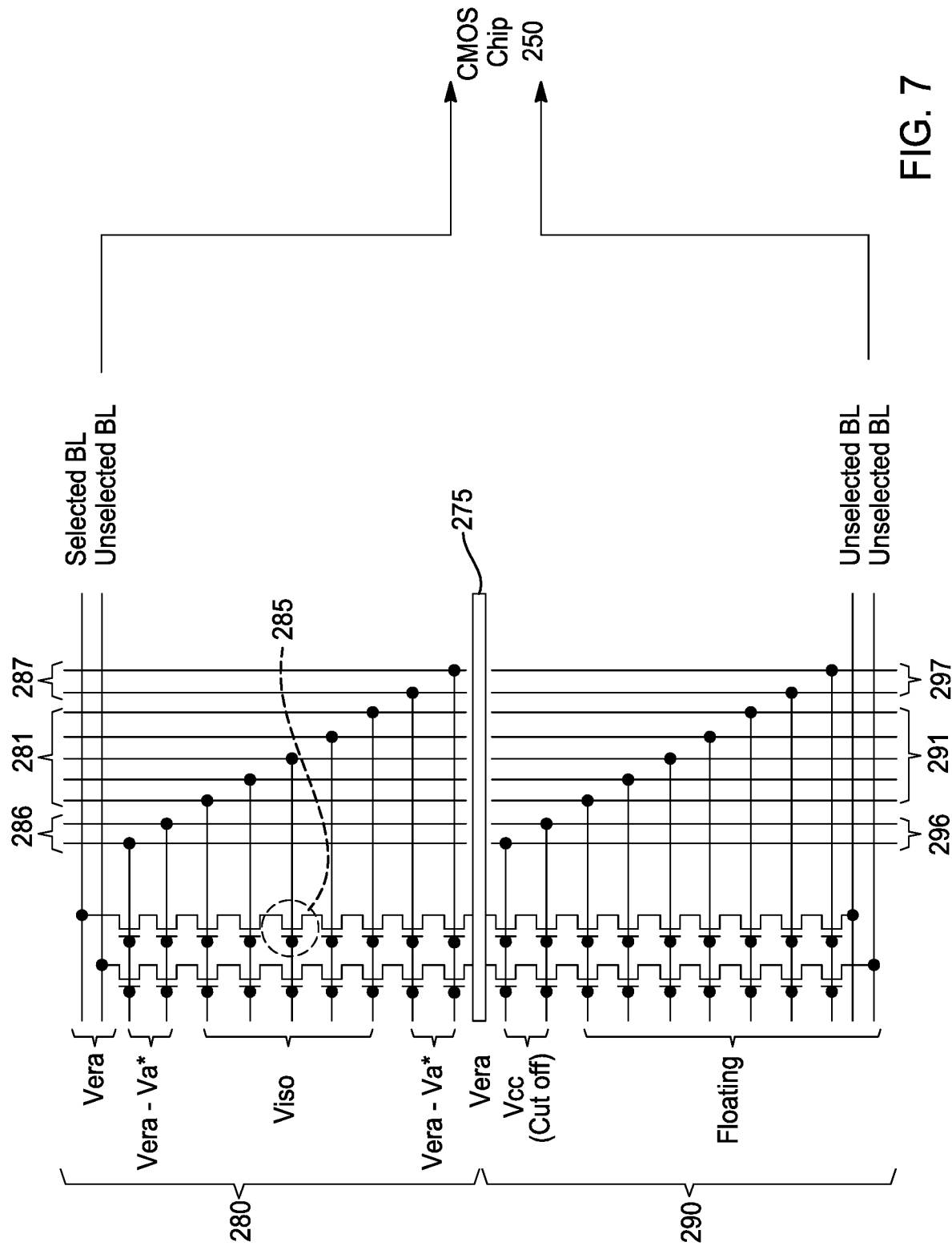
FIG. 7 illustrates voltages applied to lines of a memory cell chip during an erase operation, according to an example embodiment.

FIG. 7 illustrates voltages applied to the various lines during an erase operation, according to an example embodiment. According to this embodiment, the entire cell chip can be erased, or, only half of the cell chip 270 can be erased if only the upper region 280 or the lower region 290 is selected. FIG. 7 shows an example in which only the upper region 280 is selected. As shown, when the upper region 280 is selected, an erase voltage (Vera) is applied to the selected bit lines in the upper region 280; a voltage (Vera–Va*) is applied to the upper drain side select gate and the upper source side select gate (Va is the delta between Vera which determines the CG bias intended not to erase); and a voltage (Viso, typically close to 0V) is applied to the upper word lines. In the lower region, which is not selected, a power source cutoff voltage (i.e. power source bias) (Vcc) is applied to the lower drain side select gate, and the lower word lines, the lower bit lines, and the lower source side select gate are floated.

Figure 8A:
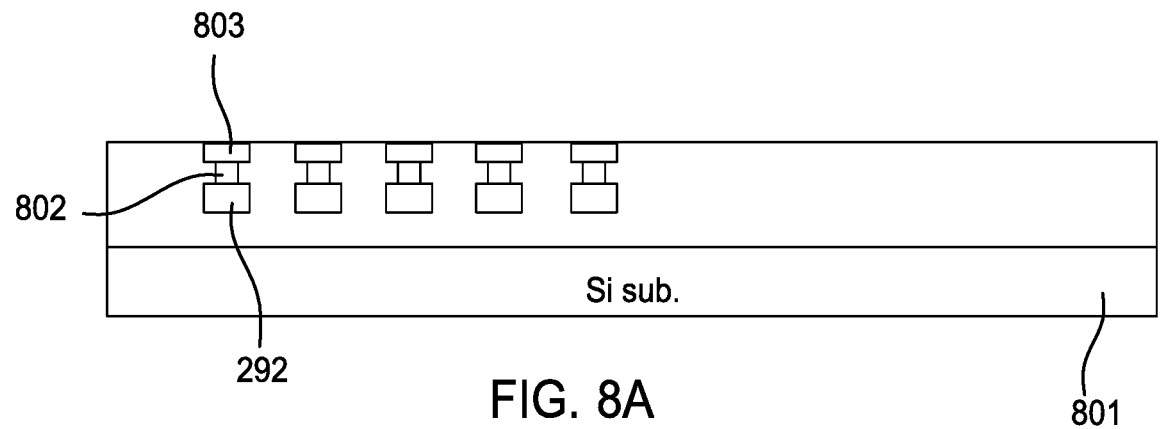
FIGS. 8A-8K illustrate operations in a process of manufacturing a 3D memory, according to an example embodiment.

FIGS. 8A-8K illustrates operations in a process of manufacturing a 3D memory according to an example embodiment. As shown in FIG. 8A, lower bit lines 292, vias 802, and memory hole pads 803 are formed on a silicon substrate 801.

Figure 8B:
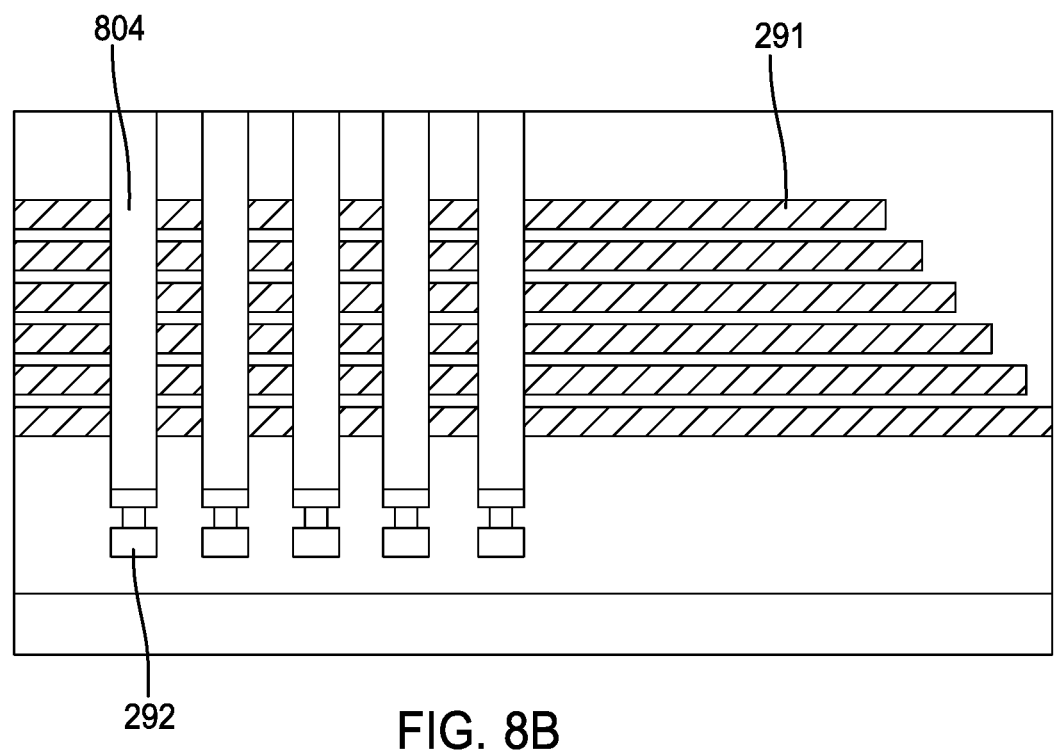

FIG. 8B illustrates the formation of the lower word lines 291 and openings 804 for formation of the lower memory holes.

Figure 8C:
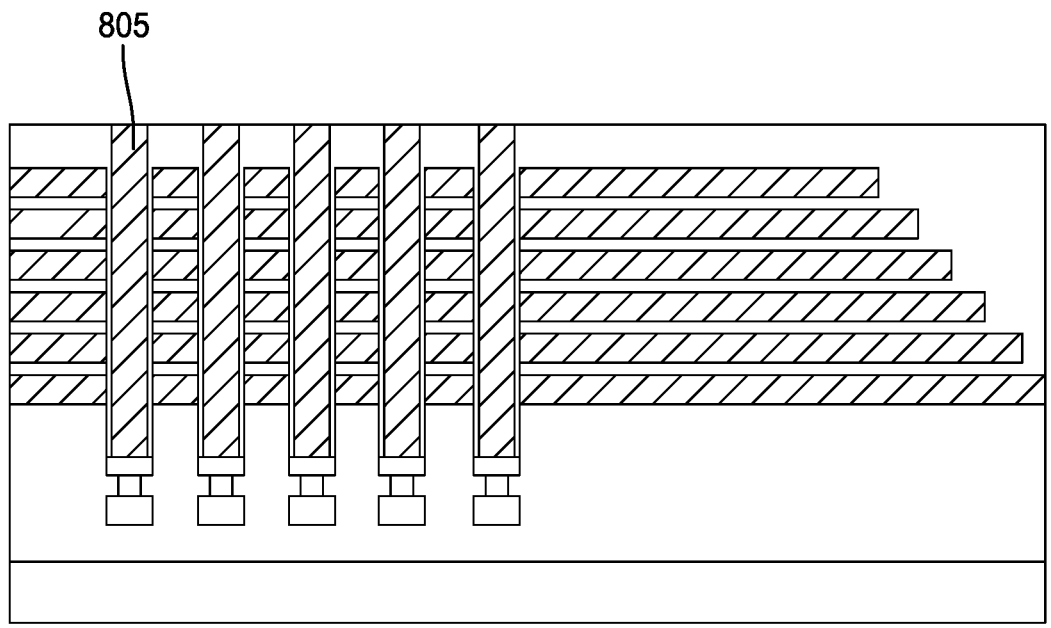

FIG. 8C illustrates the filling of the openings 804 with a sacrificial silicon nitride 805.

Figure 8D:
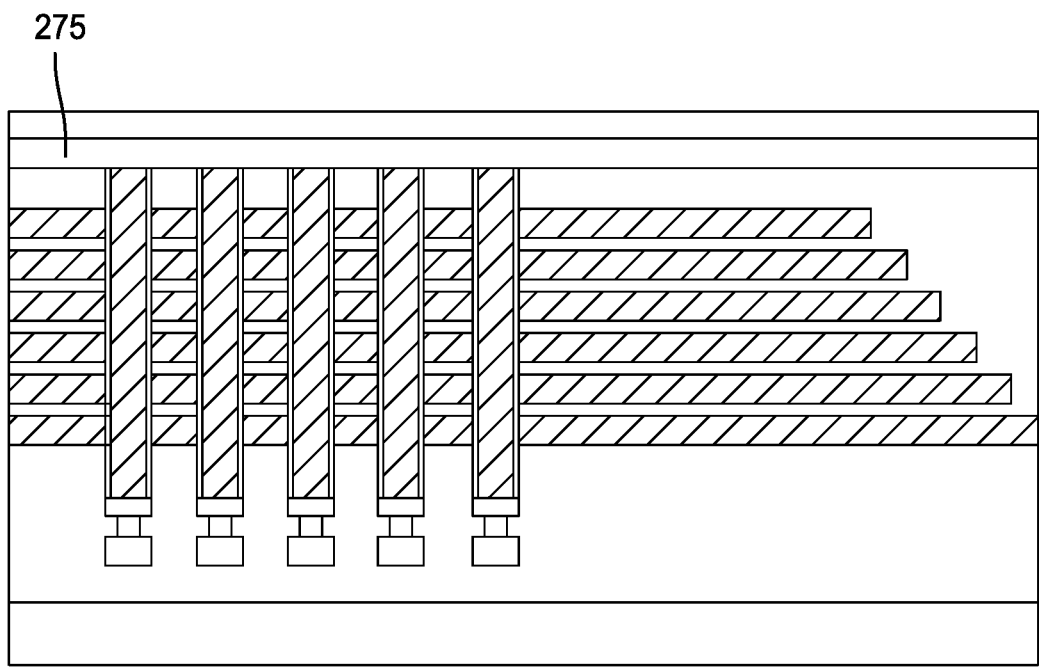

FIG. 8D illustrates deposition of the source line 275.

Figure 8E:
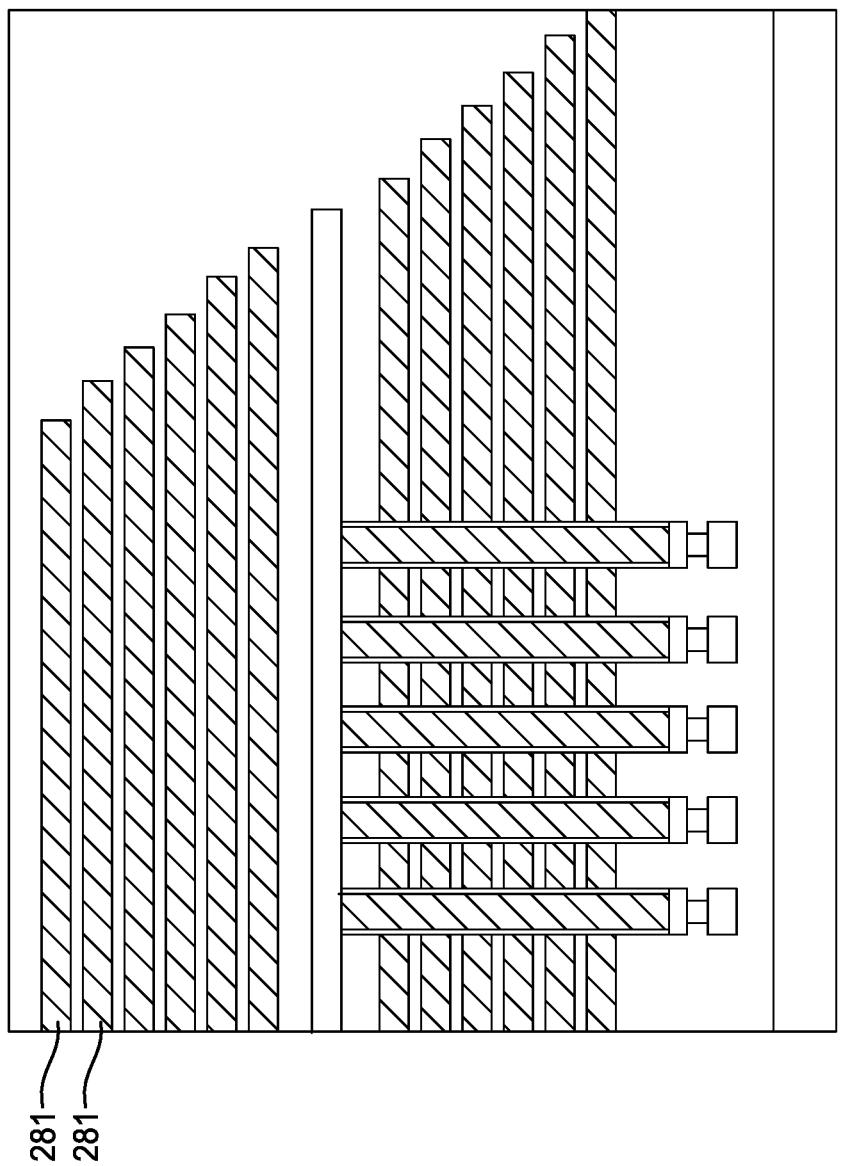

FIG. 8E illustrates formation of the upper word lines 281.

Figure 8F:
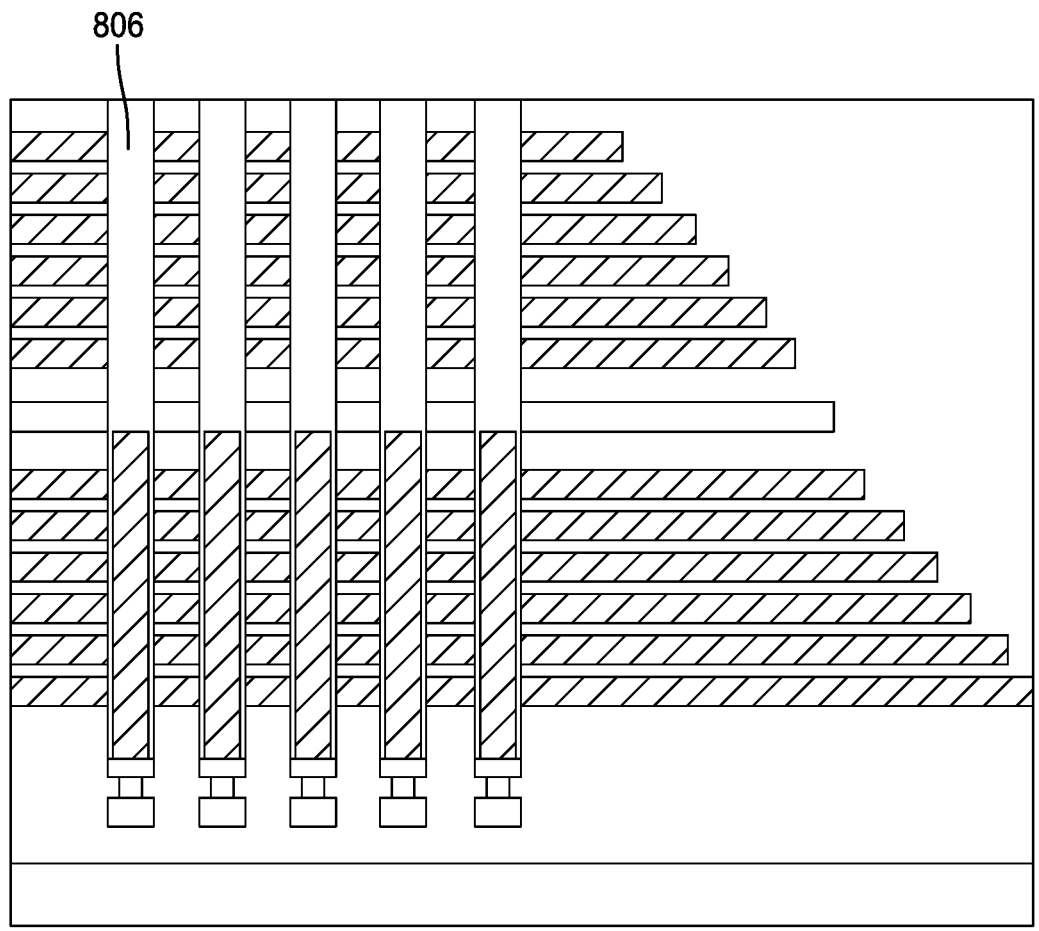

FIG. 8F illustrates formation of openings 806 for formation of the upper memory holes.

Figure 8G:
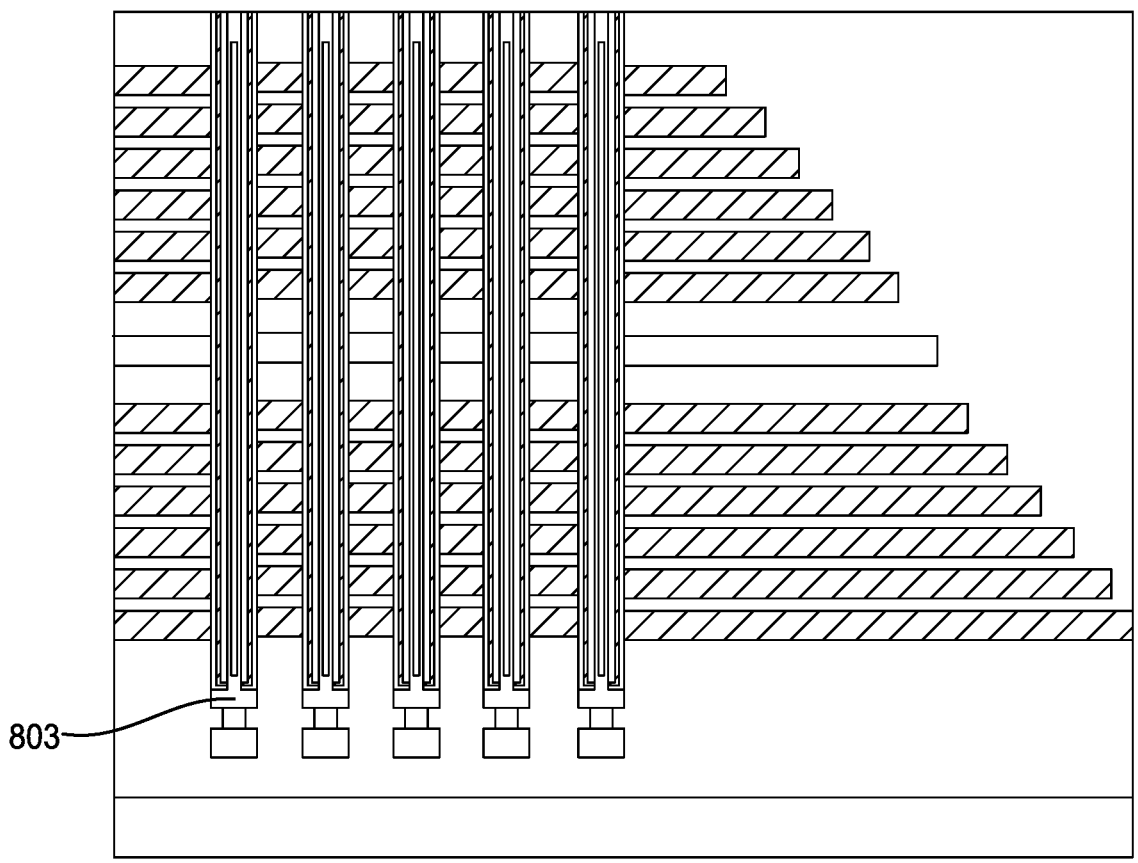

FIG. 8G illustrates connection of the upper and lower memory holes with the lower memory hole pads 803 and the source line 275.

Figure 8H:
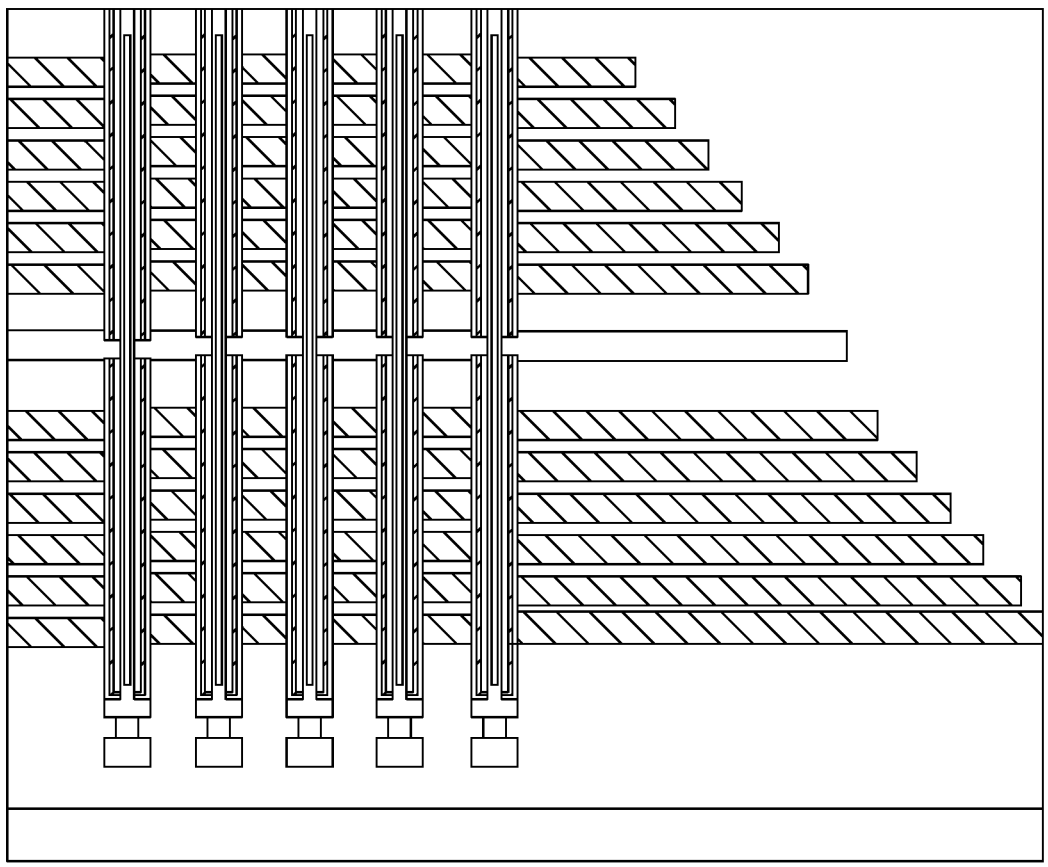

FIG. 8H illustrates replacement of the poly silicon direct source contact (DSC) and the word line with another conductive material. The poly silicon may be doped or undoped and the conductive material could be any kind of metal. In this operation, for the word line metal replace, silicon nitride ($Si_3N_4$) is layered between $SiO_2$. SiN is then replaced by hot $H_3PO_4$ diluted acid. Hot water is the main etchant. Then, block oxidation is performed and $Al_2O_3$, barrier metal (Ti/TiN) and is finally filled with tungsten (W). It is noted that a direct source contact may be omitted, as a CMOS next to array (CAN) having a source line directly placed on the Si wafer is also a possibility.

Figure 8I:
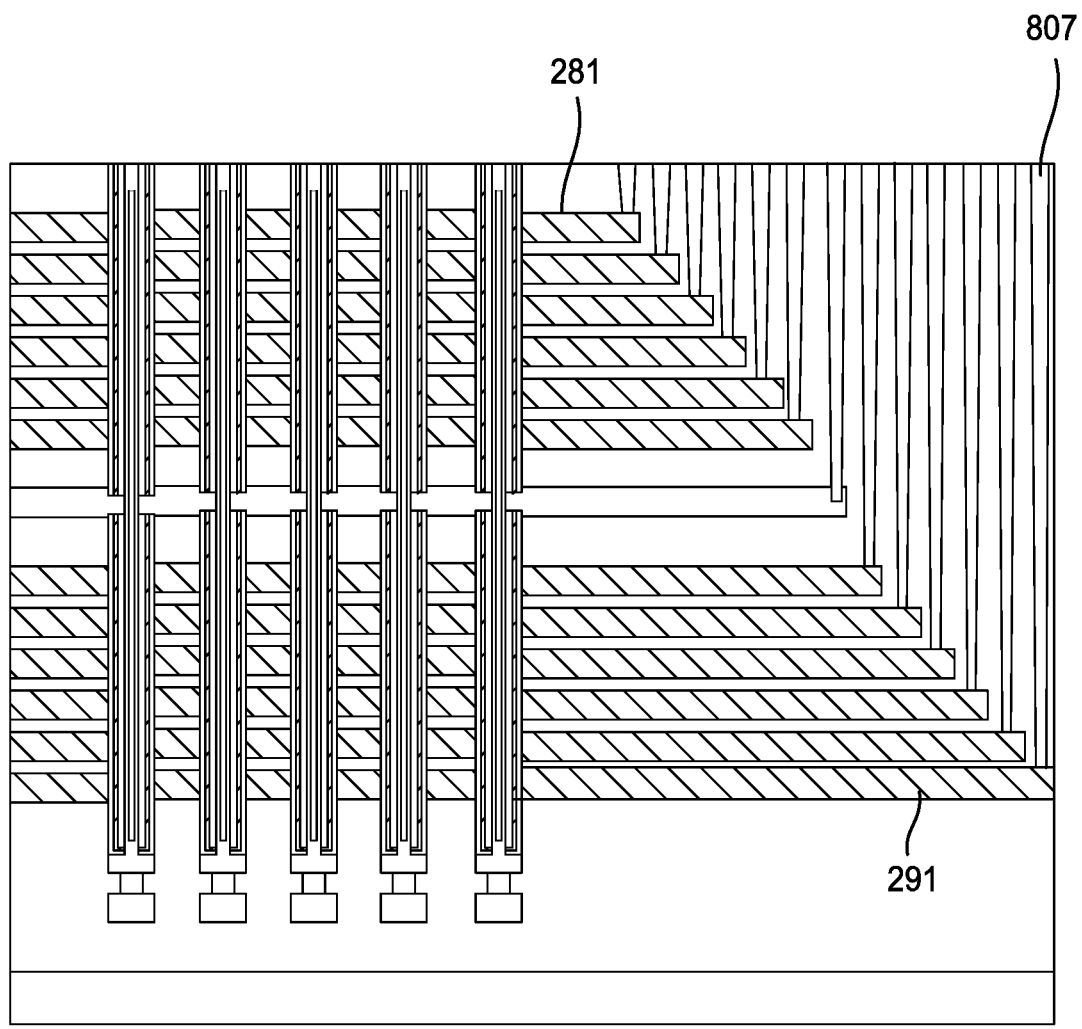

FIG. 8I illustrates formation of contacts and vias 807 connecting to the upper and lower word lines.

Figure 8J:
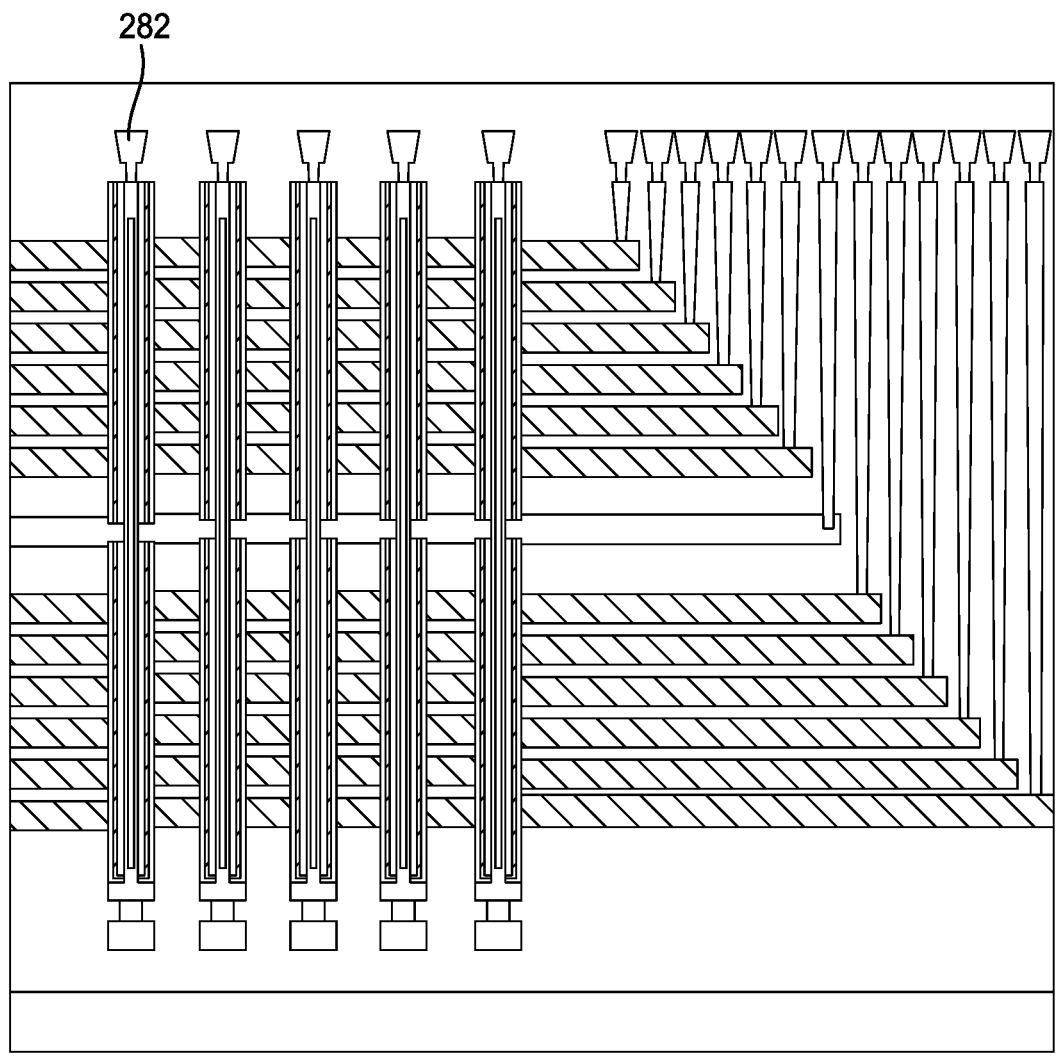

FIG. 8J illustrates formation for the upper bit line 282.

Figure 8K:
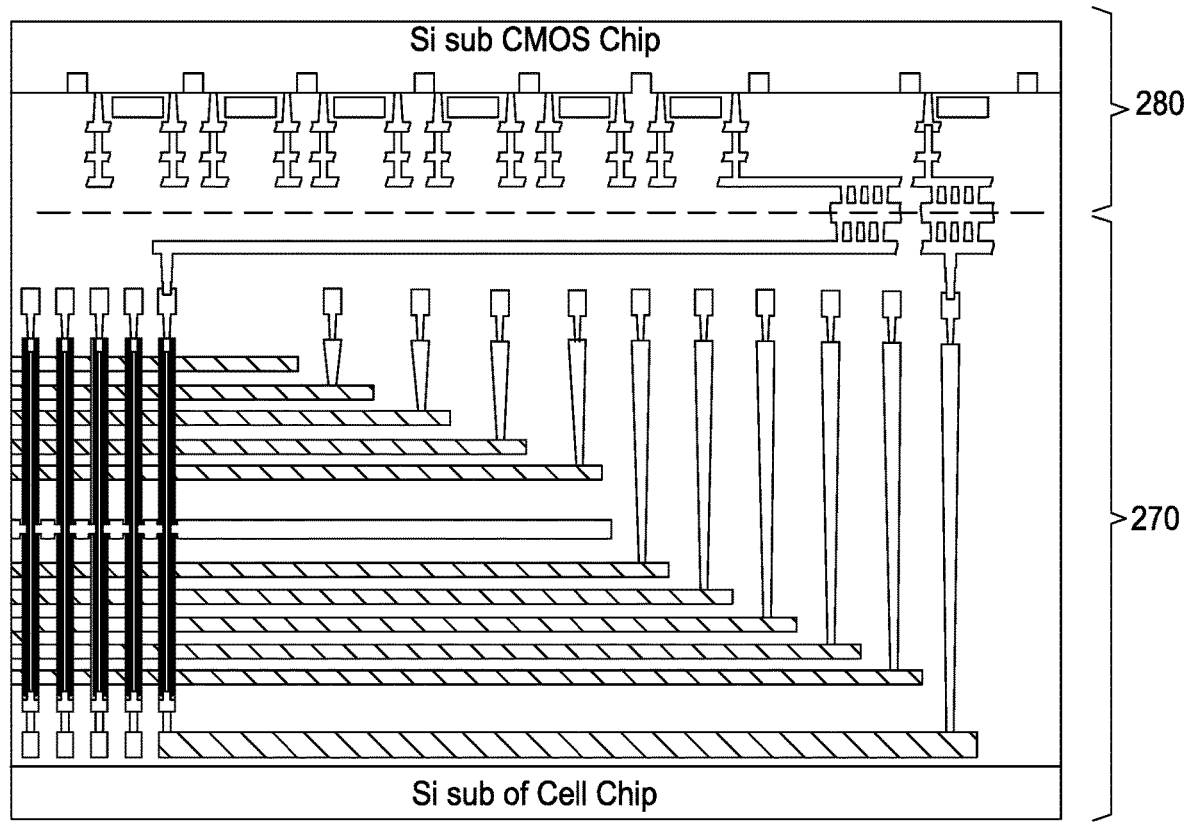

FIG. 8K illustrates the bonding of the CMOS chip 250 to the memory cell chip 270.

Figure 9A:
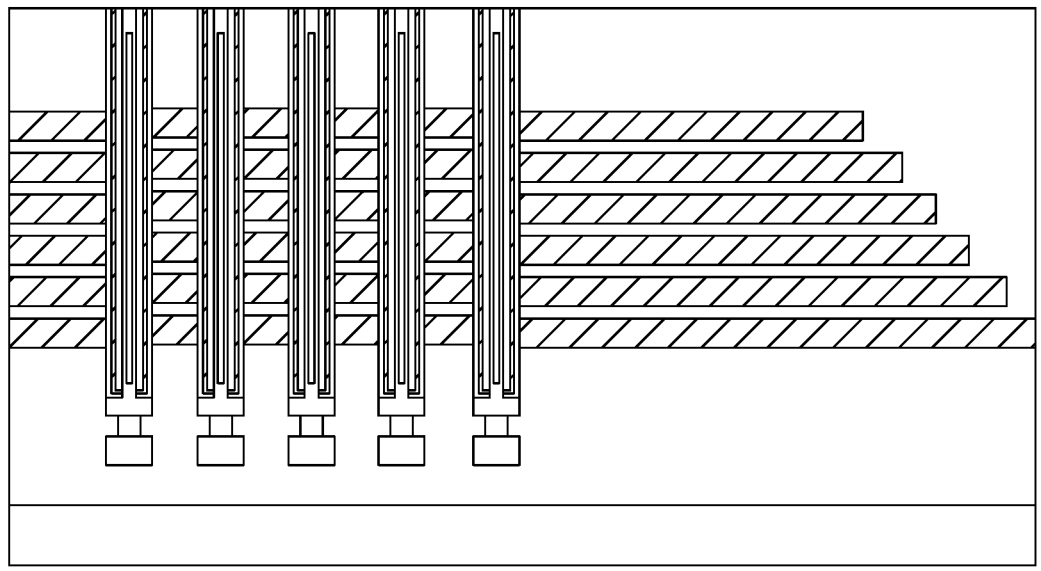
FIGS. 9A-9C illustrate alternate operations in a process of manufacturing a 3D memory, according to an example embodiment.
Figure 9B:
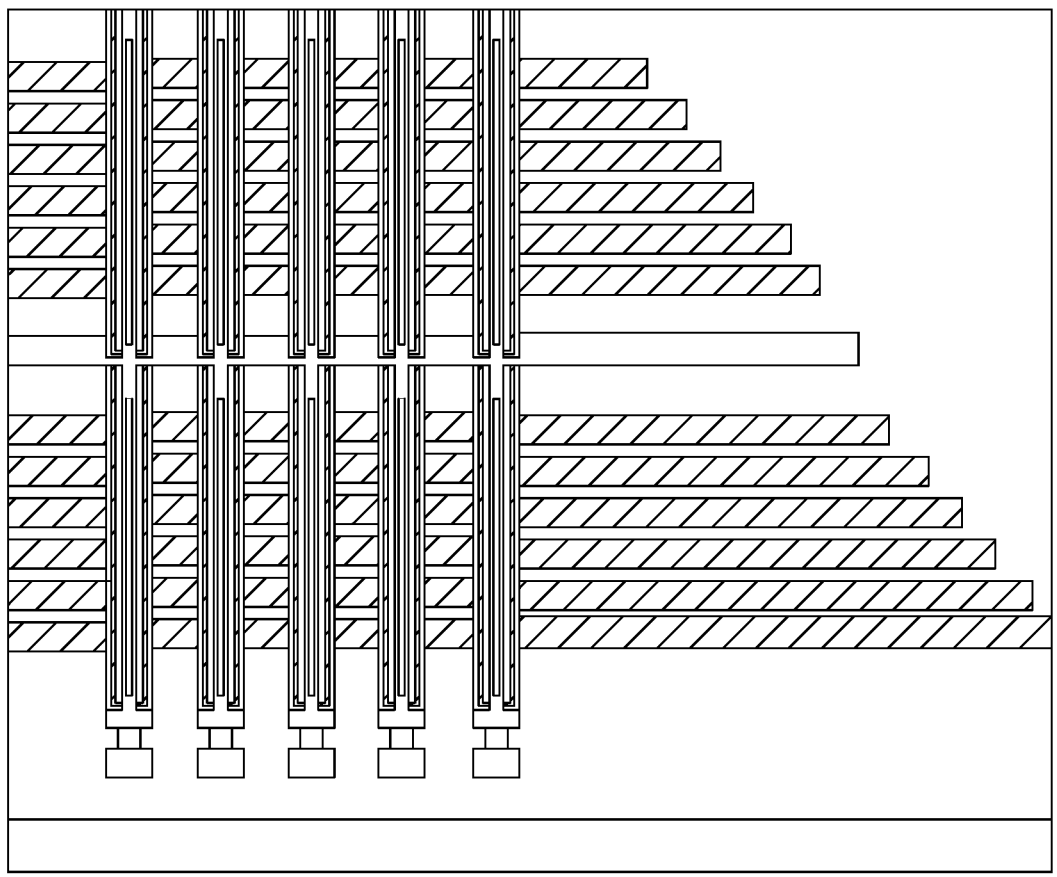
Figure 9C:
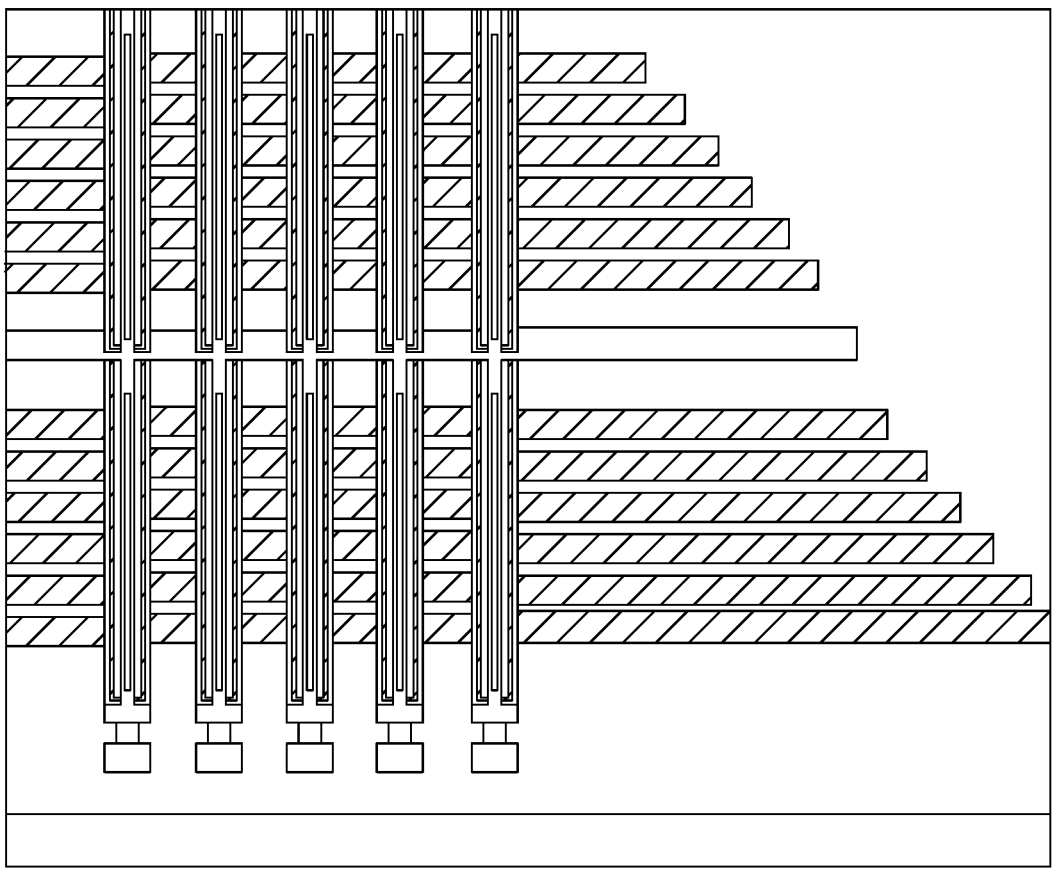

FIGS. 9A, 9B, and 9C illustrate example alternate operations of a process of manufacturing a 3D memory according to another example embodiment. According to this alternate example embodiment, a process of manufacturing includes the operations of FIGS. 8A and 8B, as discussed above, an operation of FIG. 9A, the operations of FIGS. 8D and 8E, as discussed above, the operations of FIGS. 9B, and 9C, and the operations of FIGS. 8I-8K, as discussed above.

As discussed above, after the operations of FIGS. 8A and 8B, as shown in FIG. 8C, the lower openings 804 are filled with a sacrificial silicon nitride. However, according to the alternate embodiment, as shown in FIG. 9A, after the formation of the lower memory holes (FIG. 8B), the openings 804 are filled, forming the lower memory holes and are connected to the memory hole pad. These openings 804 are filled to form MANOS structures including poly channels, a tunnel oxide, a charge trap layer (SiN), a block oxide (consisting of $SiO_2$ and high-K dielectrics). The source line 275 is deposited, as discussed with respect to FIG. 8D; the upper word lines 281 are formed, as discussed with respect to FIG. 8E; and the upper openings 806 are formed, as discussed with respect to FIG. 8F.

According to this alternate embodiment, after the formation of the openings 806, as discussed with respect to FIG. 8F, the openings 806 are filled and connected to the source line 275, as shown in FIG. 9B; and the word line replacement, as shown in FIG. 9C. The contacts connected to the upper and lower word lines 281 and 291 are formed, as discussed with respect to FIG. 8I; the upper bit lines 282 are formed, as discussed with respect to FIG. 8J; and the CMOS chip 250 is bonded to the memory cell chip 270, as discussed with respect to FIG. 8K.

According to one or more example embodiments described above, two pages can be read at the same time, thus increasing the throughput, by effectively flipping the lower region 290 of the memory over, and using the single, central, source line 275 for both the upper and lower regions.

As there are two sets of bit lines—one set for each of the upper and lower regions, this provides double the page read/write throughput. Thus, one or more example embodiments may provide faster NAND application, and double the amount of data that can be read or programmed at a time. Thus, double block size may also be possible, because each region can be operated separately.

The use of a central source line, according to one or more example embodiments, also enables, half block size operation is enabled with the erase unit separated. This is good for power efficiency.

According to one or more example embodiments, Icell characteristics may also be improved, as compared to arrays with longer channels, because, with the centrally-disposed source line, each channel is effectively half the length.

It may be understood that the example embodiments described herein may be considered in a descriptive sense only and not for purposes of limitation. Descriptions of features or aspects within each example embodiment may be considered as available for other similar features or aspects in other example embodiments.

While example embodiments have been described with reference to the figures, it will be understood by those of ordinary skill in the art that various changes in form and details may be made therein without departing from the spirit and scope as defined by the following claims.

What is claimed is:

1. A memory array chip comprising:
   a lower region comprising an array of lower memory cells, a plurality of lower word lines, and a plurality of lower bit lines disposed below the plurality of lower word lines and electrically separate from an array of upper memory cells;
   a source line disposed above the lower region;
   an upper region comprising the array of upper memory cells, a plurality of upper word lines, and a plurality of upper bit lines disposed above the plurality of upper word lines and electrically separate from the array of lower memory cells, the upper bit lines being distinct from the lower bit lines; and
   wherein the source line is connected to the array of lower memory cells and to the array of upper memory cells.

2. The memory array chip according to claim 1, wherein the plurality of upper bit lines comprise copper and the plurality of lower bit lines comprise tungsten.

3. The memory array chip according to claim 1, wherein:
   the lower region further comprises a lower drain side select gate disposed above the lower word lines and adjacent to the source line, and
   the upper region further comprises an upper drain side select gate disposed below the upper word lines and adjacent to the source line.

4. The memory array chip according to claim 3, wherein:
   the lower region further comprises a lower source side select gate disposed below the lower word lines and adjacent to the plurality of lower bit lines; and
   the upper region further comprises an upper source side select gate disposed above the upper word lines and adjacent to the plurality of upper bit lines.

5. A three-dimensional (3D) memory comprising:
   a memory array chip comprising:
   a lower array comprising a plurality of lower memory cells, a plurality of lower word lines, and a plurality of lower bit lines disposed below the plurality of lower word lines and electrically separate from a plurality of upper memory cells;
   a source line disposed above the lower array;
   an upper array comprising the plurality of upper memory cells, a plurality of upper word lines, and a plurality of upper bit lines disposed above the plurality of upper word lines and electrically separate from the plurality of lower memory cells, the upper bit lines being distinct from the lower bit lines;
   wherein the source line is connected to the plurality of lower memory cells and to the plurality of upper memory cells; and
   a complementary metal-oxide semiconductor (CMOS) chip disposed above the memory array chip and bonded to the memory array chip.

6. The 3D memory according to claim 5, wherein the plurality of upper bit lines comprise copper and the plurality of lower bit lines comprise tungsten.

7. The 3D memory according to claim 5, wherein the CMOS chip comprises a first plurality of data latches connected to the plurality of upper bit lines and a second plurality of data latches connected to the plurality of lower bit lines.

8. The 3D memory according to claim 7, wherein the CMOS chip comprises a first plurality of sense amplifiers connected to the first plurality of data latches, and a second plurality of sense amplifiers connected to the second plurality of data latches.

9. The 3D memory according to claim 5, wherein the CMOS chip comprises a first YLOG comprising a first plurality of data latches and first control circuits connected to the plurality of upper bit lines, and a second YLOG comprising a second plurality of data latches and second control circuits connected to the plurality of lower bit lines.

10. The 3D memory according to claim 5, wherein:
    the lower array of the memory array chip further comprises:
       a lower drain side select gate disposed above the lower word lines and adjacent to the source line, and
       a lower source side select gate disposed below the lower word lines and adjacent to the lower bit line; and
    the upper array of the memory array chip further comprises:
       an upper drain side select gate disposed below the upper word lines and adjacent to the source line, and
       an upper source side select gate disposed above the upper word lines and adjacent to the upper bit line.

11. The 3D memory according to claim 5, wherein the memory array chip and the CMOS chip are arranged in a CMOS adjacent to Array (CaA) architecture.

12. The 3D memory according to claim 11, wherein the CMOS chip comprises:
    a first plurality of sense amplifiers connected to a first plurality of data latches; and
    a second plurality of sense amplifiers connected to a second plurality of data latches.

13. A method of operating a three-dimensional (3D) memory comprising a lower region comprising a lower memory cell array, an upper region comprising an upper memory cell array, and a source line connected to the lower memory cell array and to the upper memory cell array, the method comprising:
    at a same time:

applying a voltage to memory cells of the upper memory cell array and to memory cells of the lower memory cell array via the source line; and applying a voltage to at least one memory cell of the upper memory cell array via an upper bit line.

14. The method according to claim 13, further comprising:

at the same time as the applying the voltage to the at least one memory cell of the upper memory cell array, applying a voltage to at least one memory cell of the lower memory cell array via a lower bit line.

15. The method according to claim 13, wherein the upper bit line and the lower bit line are symmetrically disposed with each other with respect to the source line disposed therebetween.

16. The method according to claim 13, wherein the method is an erase method and wherein:

the applying the voltage via the source line comprises applying an erase voltage to the source line;

the applying a voltage via the upper bit line comprises applying an erase voltage to the at least one memory cell of the upper memory cell array via the upper bit line; and the method further comprises, at a same time:

applying a voltage to a plurality of upper word lines connected to the upper memory cell array; and floating a plurality of lower word lines connected to the lower memory cell array.

17. The method according to claim 15, wherein:

the applying the erase voltage to the upper bit line comprises applying the erase voltage via a complementary metal-oxide semiconductor (CMOS) chip bonded to the memory chip.

18. The method according to claim 13, wherein the method is a read method further comprising, at a same time:

applying a voltage to a selected word line connected to the upper memory cell array and applying a voltage to a selected word line connected to the lower memory cell array, thereby simultaneously reading a memory cell of the upper memory cell array and a memory cell of the lower memory cell array.

19. The method according to claim 13, wherein the method is a program method further comprising, at a same time:

applying a program voltage to a selected word line connected to the upper memory cell array and applying the program voltage to a selected word line connected to the lower memory cell array, thereby simultaneously programming a memory cell of the upper memory cell array and a memory cell of the lower memory cell array.

20. The method according to claim 13, wherein the 3D memory has a CMOS adjacent to Array (CaA) architecture.

* * * * *